(12) United States Patent
Mimran et al.

(10) Patent No.: US 9,148,910 B1
(45) Date of Patent: Sep. 29, 2015

(54) METHOD AND APPARATUS FOR HEATING UP INTEGRATED CIRCUITS

(71) Applicant: Marvell Israel (M.I.S.L) Ltd., Yokneam (IL)

(72) Inventors: Arik Mimran, Haifa (IL); Ziv Harel, Yokneam Ilit (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 385 days.

(21) Appl. No.: 13/680,900

(22) Filed: Nov. 19, 2012

Related U.S. Application Data

(60) Provisional application No. 61/562,300, filed on Nov. 21, 2011.

(51) Int. Cl.
*H05B 1/02* (2006.01)
*H05B 1/00* (2006.01)

(52) U.S. Cl.
CPC ........................................ *H05B 1/00* (2013.01)

(58) Field of Classification Search
CPC ...... H05B 1/00; H05B 3/0047; H05B 1/0233; H05B 3/026; H05B 3/28
USPC ................. 219/481, 482, 494, 497, 499, 505, 219/501.209, 210
See application file for complete search history.

(56) References Cited

U.S. PATENT DOCUMENTS

| | | | | |
|---|---|---|---|---|
| 5,309,090 | A * | 5/1994 | Lipp | 324/750.03 |
| 5,798,667 | A * | 8/1998 | Herbert | 327/573 |
| 6,329,642 | B1 * | 12/2001 | Kaneko et al. | 219/497 |
| 6,433,567 | B1 * | 8/2002 | Okayasu | 324/750.03 |
| 6,861,860 | B2 * | 3/2005 | Maggi et al. | 324/750.05 |
| 7,265,566 | B2 * | 9/2007 | Graf | 324/750.3 |
| 7,619,427 | B2 * | 11/2009 | Ando et al. | 324/750.13 |
| 7,656,734 | B2 | 2/2010 | Thorp et al. | |
| 7,726,877 | B1 | 6/2010 | Avitan | |
| 7,859,918 | B1 | 12/2010 | Nguyen et al. | |
| 8,093,535 | B2 * | 1/2012 | Heismann et al. | 219/494 |
| 8,927,909 | B2 * | 1/2015 | Le Neel et al. | 219/494 |
| 2011/0255353 | A1 | 10/2011 | Fukushima et al. | |

OTHER PUBLICATIONS

U.S. Appl. No. 13/015,139, entitled "Method and Apparatus for Warming Up Integrated Circuits." filed on Jan. 27, 2011, by Yosef Solt.

* cited by examiner

*Primary Examiner* — Mark Paschall (57) ABSTRACT

Aspects of the disclosure provide an integrated circuit (IC) chip that includes a heating element and a heating control circuit. The heating element is configured to be controllable to generate heat. The heating control circuit is configured to be operable when an IC chip temperature is below a threshold. The heating control circuit is configured to receive a signal indicative of a sensed temperature and control the heating element to generate heat to raise the IC chip temperature when the sensed temperature is below the threshold.

16 Claims, 4 Drawing Sheets

METHOD AND APPARATUS FOR HEATING UP INTEGRATED CIRCUITS

INCORPORATION BY REFERENCE

This present disclosure claims the benefit of U.S. Provisional Application No. 61/562,300, "I-Temp Heating Core" filed on Nov. 21, 2011, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, integrated circuit (IC) chips are required to be operational when chip temperature is within a temperature range, such as [0° C., 125° C.] for a commercial class product. The temperature range can be referred to as a commercial temperature range. Sometimes, the chip temperature is affected by an ambient temperature that can be out of the commercial temperature range, such as below 0° C. Supporting this extended temperature range requires additional significant IC design/verification/testing efforts to prevent circuit malfunctions, logical errors and such.

SUMMARY

Aspects of the disclosure provide an integrated circuit (IC) chip that includes a heating element and a heating control circuit. The heating element is configured to be controllable to generate heat. The heating control circuit is configured to be operable when an IC chip temperature is below a threshold. The heating control circuit is configured to receive a signal indicative of a sensed temperature and control the heating element to generate heat to raise the IC chip temperature when the sensed temperature is below the threshold.

Further, in an embodiment, the IC chip includes a temperature sensing element configured to generate the signal indicative of the sensed temperature.

According to an aspect of the disclosure, the IC chip includes a functional circuit configured to be operative when the sensed temperature is above the threshold. Then, the heating control circuit is configured to control a power control circuit to provide electrical power to the functional circuit when the sensed temperature is raised above the threshold in response to a power start-up. Further, in an example, the heating control circuit is configured to control the heating element to generate heat to keep the sensed temperature above the threshold after the power start-up. In an example, the functional circuit includes a phase-locked loop (PLL) configured to generate a clock signal.

According to another aspect of the disclosure, the IC chip is electrically and thermally coupled with another IC chip that includes a functional circuit configured to be operative when the sensed temperature is above the threshold. Then, the heating control circuit is configured to control a power control circuit on the other IC chip to provide electrical power to the functional circuit when the sensed temperature is raised above the threshold in response to a power start-up. Further, the heating control circuit is configured to control the heating element to generate heat to keep the sensed temperature above the threshold after the power start-up.

In an embodiment, the heating element is at least partially disposed in a layer dedicated to provide a circuit heating function.

Aspects of the disclosure provide a method. The method includes powering up a heating control circuit configured to be operable when a temperature is below a threshold at which circuits on an integrated circuits chip are functional, receiving a signal indicative of a sensed temperature, and controlling a heating element formed of circuitry components thermally coupled to the integrated circuit chip to generate heat when the sensed temperature is below the threshold to heat up the integrated circuit chip.

Aspects of the disclosure provide an integrated circuit (IC) package. The IC package includes a first IC chip and a second IC chip that is electrically and thermally coupled with the first IC chip. The first IC chip includes a functional circuit configured to be operative when a temperature is above a threshold. The second IC chip includes a heating element configured to be controllable to generate heat, and a heating control circuit configured to be operable when an IC chip temperature is below a threshold. The heating control circuit is configured to receive a signal indicative a sensed temperature and control the heating element to generate heat when the sensed temperature is below the threshold.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
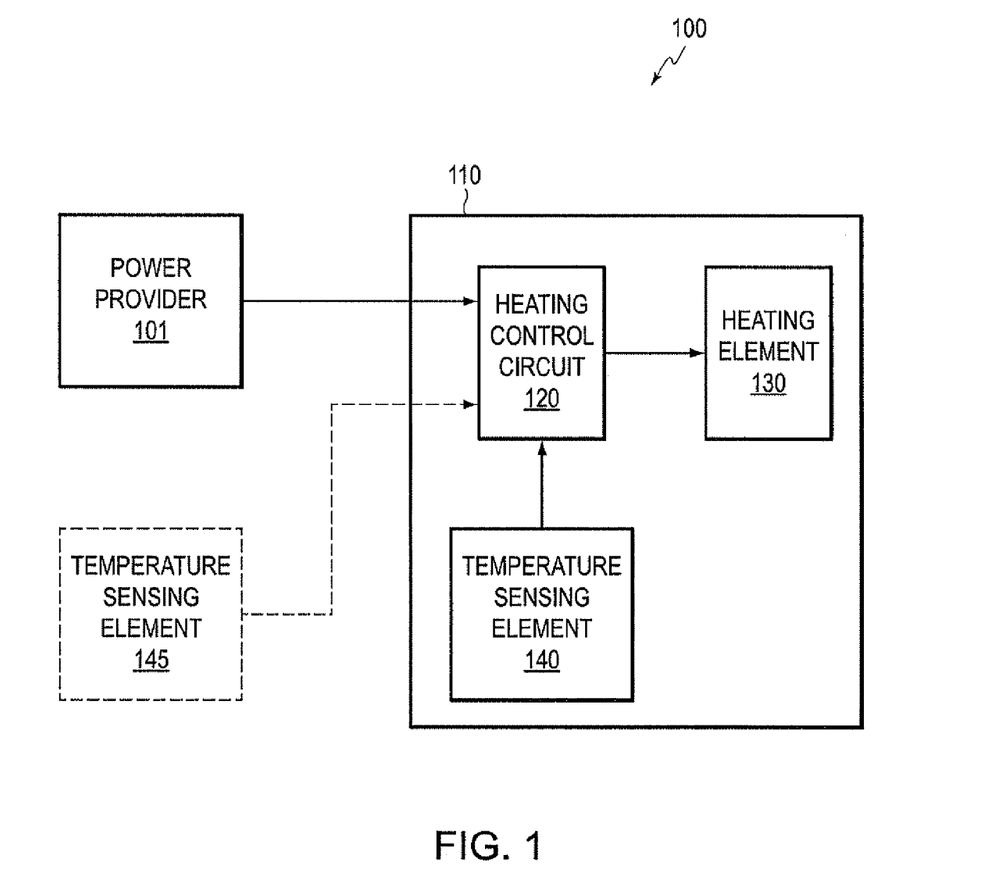
FIG. 1 shows a block diagram of an electronic system example 100 according to an embodiment of the disclosure.

FIG. 1 shows a block diagram of an electronic system example 100 according to an embodiment of the disclosure. The electronic system 100 includes an integrated circuit (IC) chip 110 and a power provider 101 that provides electrical power to the IC chip 110. The IC chip 110 includes a heating control circuit 120, a heating element 130, and a temperature sensing element 140. The heating control circuit 120 controls the heating element 130 to operate based on a sensed temperature by the temperature sensing element 140. These elements are coupled together as shown in FIG. 1.

According to an aspect of the disclosure, the heating element 130 can be any suitable heating element, such as resistors, transistors, and the like. In an example, the heating element 130 includes resistors formed in a semiconductor manufacturing layer, such as a polysilicon layer, a doped substrate layer, and the like or/and usage of the IC power dissipating circuits. The resistors conduct a current and generate heat when a supply voltage is applied to the resisters. In an embodiment, resistance of the resistors is suitably determined to limit the current conducted by the resistors, and thus limit the power consumed to generate heat.

In an embodiment, the heating element 130 is made up of multiple distributed heating elements that are coupled by way of a power grid. Further, in an example, all that the heating element(s) 130 need to do is to suitably heat up the chip and that the heating element(s) 130 have no effect on logic functionality during the heating up operation.

It is noted that, in an example, the heating element 130 is distributed uniformly throughout selected parts of the IC chip 110 to heat uniformly across the respective selected parts of IC chip 110. In another example, the heating element 130 is distributed locally in one or more areas of the IC chip 110 to heat those areas locally.

Further, according to an aspect of the disclosure, the temperature sensing element 140 can be any suitable element, such as a thermal diode, a ring oscillator, a temperature sensing circuit, and the like, configured to generate a signal indicative of a chip temperature. In an example, the temperature sensing element 140 includes a temperature sensing circuit disclosed in U.S. Pat. No. 7,726,877, which is incorporated herein by reference in its entirety. In another example, the temperature sensing element includes a ring oscillator that outputs an oscillating signal with a frequency as a function of the chip temperature.

It is noted that, in an example, multiple temperature sensing elements 140 are disposed at different locations in the IC chip 110 to sense the chip temperature at the different locations in the IC chip 110. It is also noted that, in an example, the electronic system 100 includes a temperature sensing element 145 that is external to the IC chip 110. The temperature sensing element 145 provides a signal indicative of a sensed temperature, such as an ambient temperature, an outer surface temperature, and the like to the heating control circuit 120.

According to an aspect of the disclosure, the heating control circuit 120 is operative in a relatively large temperature range, such as an industrial temperature range of [−40° C., 125° C.]. Specifically, in an example, the heating control circuit 120 is not sensitive to temperature, and operates in a similar manner in the large temperature range, and can properly start operation at a low chip temperature, such as at −40° C. In an embodiment, the power provider 101 is switchable. Before the power provider 101 is switched on, the IC chip 110 typically has a chip temperature that is about the same as an ambient temperature that can be out of the commercial temperature range of [0° C., 125° C.] sometimes. When the power provider 101 is switched on, the heating control circuit 120 is powered up and operates properly.

In an embodiment, the heating control circuit 120 is configured to control the heating element 130 to generate heat to raise the chip temperature above a threshold, such as above the lower limit of the commercial temperature range. Further, the heating control circuit 120 controls the heating element 130, such as turns on/off the heating element 130, adjusts the current conducted by the heating element 130, and the like, to maintain the chip temperature to remain within a suitable temperature range, such as the commercial temperature range, and the like.

According to an aspect of the disclosure, the IC chip 110 includes functional circuits (not shown) that are operative in the commercial temperature range of the IC chip 110. In an example, those function circuits are designed to be operative in the commercial temperature range, and are tested in the commercial temperature range to ensure proper operations. The functional circuits may or may not be operative when the chip temperature is out of the commercial temperature range. In an embodiment, during operation, the heating control circuit 120 controls the heating element 130 to raise and maintain the chip temperature above the lower limit of the commercial temperature range, such that the functional circuits can operate properly. Thus, if during operation of the IC chip 110, the temperature sensing element 140 senses that chip temperature is falling to be outside the commercial temperature range of IC chip 110, a signal is provided to activate the heating control circuit 120 and heat up the IC chip 110.

According to another aspect of the disclosure, the IC chip 110 is located in a proximity of another IC chip (not shown), such as within a same IC package, and is thermally coupled with the other IC chip. Specifically, the temperature sensing element 140 generates the signal indicative of the chip temperature of the other IC chip, and the heating element 130 generates heat to heat up the other IC chip. The other IC chip includes functional circuits that are operative in the commercial temperature range. Thus, during operation, the heating control circuit 120 controls the heating element 130 to raise and maintain the chip temperature of the other IC chip above the lower limit of the commercial temperature range, such that the functional circuits on the other IC can operate properly.

Figure 2:
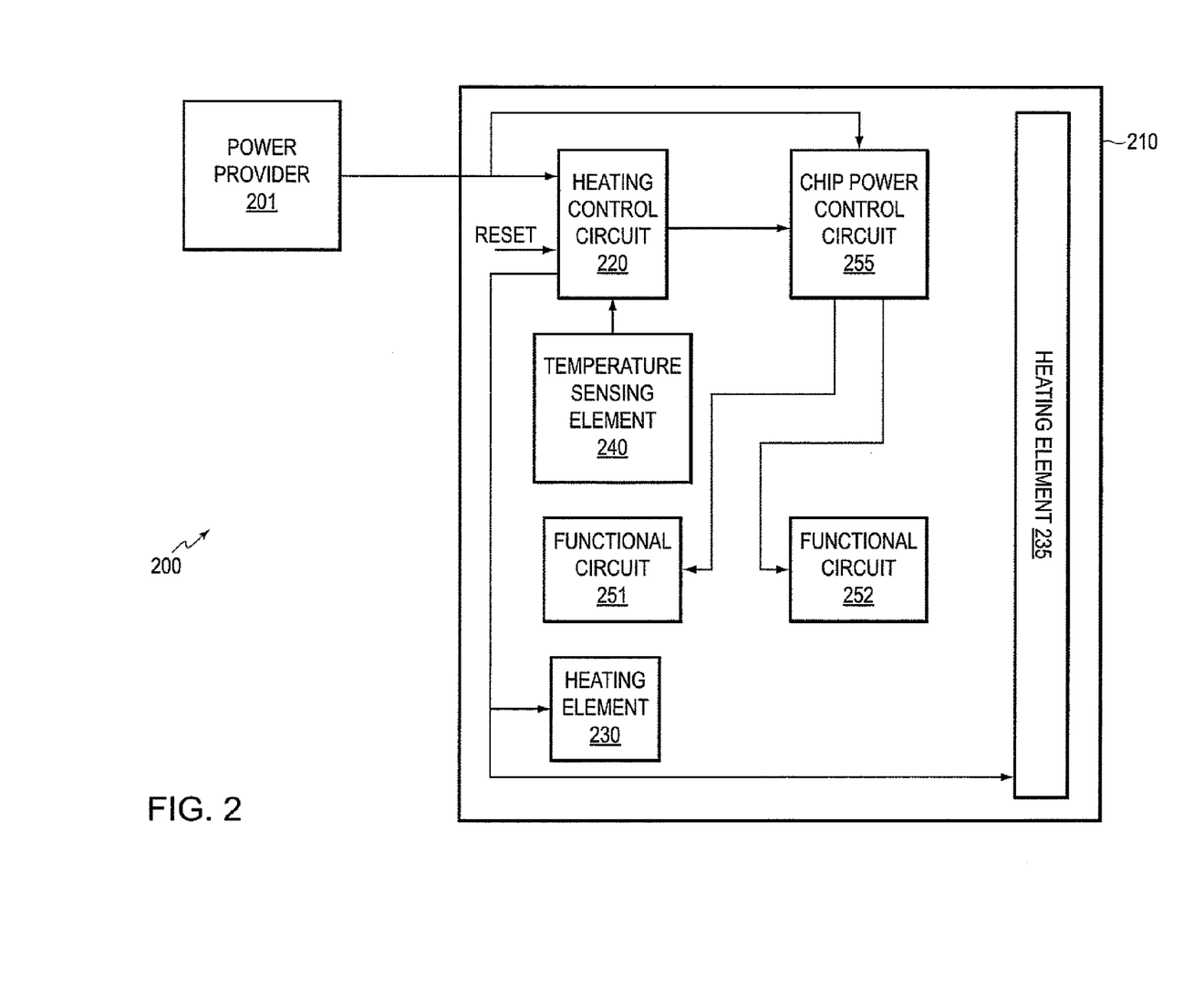
FIG. 2 shows a block diagram of another electronic system example 200 according to an embodiment of the disclosure.

FIG. 2 shows a block diagram of an electronic system example 200 according to an embodiment of the disclosure. The electronic system 200 includes an IC chip 210 and a power provider 201 that provides electrical power to the IC chip 210. The IC chip 210 includes various functional circuits 251-252, a heating control circuit 220, a chip power control circuit 255, heating elements 230 and 235, and a temperature sensing element 240. These elements are coupled together as shown in FIG. 2.

According to an aspect of the disclosure, the various functional circuits 251-252 are designed and tested to operate in the commercial temperature range. The various functional circuits 251-252 can have different temperature sensitivity. For example, the functional circuit 251 includes a phase-locked loop (PLL) that is relatively sensitive to temperature. In an example, the PLL can operate properly in the commercial temperature range, however it may not properly startup when the chip temperature is below the lower limit of the commercial temperature range. The PLL is used to generate a clock signal to be distributed in the IC chip 210 to other circuits, such as a processor, a memory, logic circuits, and the like to enable the other circuits to operate. Thus, the other circuits operations depend on the PLL. In an example, when the PLL cannot start up, the other circuits cannot start operation.

The heating elements 230 and 235 operate similarly to the heating element 130 described above, and also utilize certain components that are identical or equivalent to those used in the heating element 130; the description of these components has been provided above and will be omitted here for purposes of clarity and brevity.

The temperature sensing element 240 operates similarly to the temperature sensing element 140 described above, and also utilizes certain components that are identical or equivalent to those used in the temperature sensing element 140; the description of these components has been provided above and will be omitted here for purposes of clarity and brevity.

In the FIG. 2 example, the heating element 230 and the temperature sensing element 240 are disposed in a proximity to temperature sensitive circuits, such as the PLL in the functional circuit 251, therefore the heating element 230 and the temperature sensing element 240 are thermally coupled with the temperature sensitive circuits. Then, the signal generated by the temperature sensing element 240 is more accurately indicative of the local chip temperature at the PLL, for example, and the heating element 230 can more effectively raise the local chip temperature for the PLL.

In an example, the heating element 235 is a dedicated heating element that does not have other functions. In an embodiment, the heating element 235 is disposed on a layer dedicated to provide the heating functionality. Thus, the heating element 235 can be disposed uniformly across the IC chip 235 to uniformly heat the IC chip 210. It is noted that, in an example, the heating control circuit 220 controls the heating elements 230 and 235 in the same manner. In another example, the heating control circuit 220 controls the heating element 230 and the heating element 235 in different manners, such as provides separate control signals to the heating element 230 and heating element 235.

The chip power control circuit 255 receives the electrical power from the power provider 201 and receives a control signal from the heating control circuit 220. The chip power control circuit 255 provides the electrical power to the various functional circuits 251-252 based on the control signal. Specifically, in an example, the chip power control circuit 255 includes a power distribution grid that distributes the electrical power to the various functional circuits 251-252. Further, the chip power control circuit 255 includes switch control logic circuits that can switch on/off the entire power distribution grid or portions of the power distribution grid based on the control signal from the heating control circuit 220.

According to an aspect of the disclosure, the heating control circuit 220 is not sensitive to temperature and can be operative in a relatively large temperature range, such as the industrial temperature range of [−40° C., 125° C.]. Note that in an embodiment, the heating control circuit 220 is operative at temperatures below the commercial operating temperature of IC chip 210. The heating control circuit 220 receives the electrical power from the power provider 201, and can properly start operation even when the chip temperature is relatively low, such as when the temperature is in [−40° C., 0° C.].

In an embodiment, the power provider 201 is switchable. Before the power provider 201 is switched on, the IC chip 210 typically has a chip temperature that is about the same as an ambient temperature that may be out of the commercial temperature range of [0° C., 125° C.]. When the power provider 201 is switched on, the heating control circuit 220 is powered up and operates properly.

In an embodiment, when the heating control circuit 220 is powered up, the heating control circuit 220 provides the control signal to control the chip power control circuit 255 not to provide the electrical power to the temperature sensitive circuits, such as the PLL. In another embodiment, at default, the chip power control circuit 255 is configured not to provide the electrical power to the temperature sensitive circuits in response to a power-up of the IC chip 210.

Further, the heating control circuit 220 receives a signal from the temperature sensing element 240 that is indicative of the local chip temperature of the temperature sensitive circuits. Based on the local chip temperature, the heating control circuit 220 adjusts the control signal to the chip power control circuit 255.

In an example, when the local chip temperature is in the commercial temperature range, the heating control circuit 220 adjusts the control signal to control the chip power control circuit 255 to provide the electrical power to the temperature sensitive circuits to start up the temperature sensitive circuits. When the local chip temperature is below the lower limit of the commercial temperature range, the heating control circuit 220 maintains the control signal not to provide the electrical power to the temperature sensitive circuits. In addition, the heating control circuit 220 controls the heating elements 230 and 235 to generate heat to raise the chip temperature, especially the local chip temperature of the temperature sensitive circuits, to above the lower limit of the commercial temperature range. Then, the heating control circuit 220 adjusts the control signal to let the chip power control circuit 255 to provide the electrical power to the temperature sensitive circuits.

According to an embodiment of the disclosure, the heating control circuit 220 then controls the heating elements 230 and 235, such as to turn on/off those heating elements 230, 235, adjusts a voltage or a current to those heating elements, and the like, to maintain the chip temperature to stay in a suitable range, such as the commercial temperature range, and the like. Note that during normal operation, IC chip typically self generates sufficient heat to maintain chip heat above the lower end of the commercial temperature range. As such temperature sensing circuit and heating control circuit are configured to deactivate the heating elements whenever the temperature exceeds a predetermined minimum temperature, so as not to draw excessive power, and to activate the heating elements, during operation of the IC chip, whenever the chip approaches or falls below a minimum operating temperature, for example because of inactivity and/or exposure to a low ambient temperature.

According to an aspect of the disclosure, the IC chip 210 includes a sleep mode. In an example, when the IC chip 210 enters the sleep mode, portions of the circuits, such as the functional circuit 251 that is temperature sensitive, is turned off. For example, the chip power control circuit 255 switches off a portion of the power distribution grid and thus so as not to distribute the electrical power to the functional circuit 251.

In an embodiment, when the functional circuit 251 is turned off, the heating control circuit 220 turns off the heating elements 230 and 235 to save power. At the wake-up time, in an example, the heating control circuit 220 operates similarly as at the power up time. For example, the heating control circuit 220 controls the heating element 230 to raise the local temperature of the functional circuit 251 above the lower limit of the commercial temperature range, and then controls the chip power control circuit 255 to provide the electrical power to the functional circuit 251.

It is noted that, in another embodiment, in the sleep mode, the heating control circuit 220 controls the heating elements 230 and 235 to maintain the local temperature above the lower limit of the commercial temperature range. Thus, at the wakeup time, the electrical power can be provided to the functional circuit 251 without waiting for raising the temperature.

According to another embodiment of the disclosure, the IC chip 210 resets in response to a reset signal. The reset signal can be provided by a component that is external to the IC chip 210, or can be generated internally in the IC chip 210. The reset signal can be provided to the heating control circuit 220. The heating control circuit 220 can operate similarly as at the power-up time in response to the reset signal.

Figure 3:
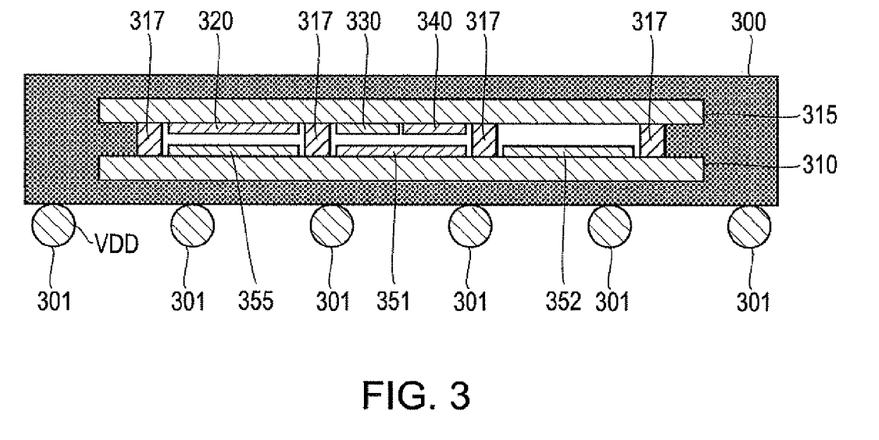
FIG. 3 shows a block diagram of an integrated circuit (IC) package 300 cross-section according to an embodiment of the disclosure.

FIG. 3 shows a block diagram of an integrated circuit (IC) package 300 cross-section according to an embodiment of the disclosure. The IC package 300 includes a first IC chip 310 and a second IC chip 315 inside the package. The first IC chip 310 includes a chip power control circuit 355 and various functional circuits 351-352. The second IC chip 315 includes a heating control circuit 320, a heating element 330 and a temperature sensing element 340. The IC package 300 is operative in a wide temperature range, such as the industrial temperature range.

According to an aspect of the disclosure, the various functional circuits 351-352 are designed and tested to operate in the commercial temperature range. Similarly to the functional circuits 251-252 in FIG. 2, the various functional circuits 351-352 can have different temperature sensitivity. For example, the functional circuit 351 includes a phase-locked loop (PLL) that is sensitive to temperature. In an example, the PLL can operate properly in the commercial temperature range, and may not properly startup when the chip temperature is below the lower limit of the commercial temperature range. In an example, the PLL is used to generate a clock signal that is distributed in the first IC chip 310 to other circuits, such as a processor, a memory, and the like to enable the operations of the other circuits. In another example, the functional circuit 352 is not sensitive to temperature, and can operate properly in a wider temperature range, such as in the industrial temperature range.

In an embodiment, the first IC chip 310 is a chip that is designed and tested to be operative in the commercial temperature range. The first IC chip 310 can be an existing chip or a chip of an existing design. The IC chip 310 is thermally and electrically coupled with the second IC chip 315 to enable the IC chip 310 to be operative at a low ambient temperature, such as below the lower limit of the commercial temperature range.

In the second IC chip 315, the heating elements 330 operates similarly to the heating element 130 and the temperature sensing element 340 operate similarly to the temperature sensing element 140 described above. The heating element 330 utilizes certain components that are identical or equivalent to those used in the heating element 130 and the temperature sensing element 340 utilizes certain components that are identical or equivalent to those used in the temperature sensing element 140; the description of these components has been provided above and will be omitted here for clarity purposes.

In the FIG. 3 example, the first IC chip 310 and the second IC chip 315 are thermally and electrically coupled together. Specifically, in an example, the first IC chip 310 and the second IC chip 320 are placed face to face. Both IC chips includes contact components, such as contact pads and the like, that can be aligned and then electrically connected using conductive components 317, such that electrical signals can be transmitted between the two IC chips. In an example, the heating control circuit 320 on the second IC chip 315 sends a control signal to the chip power control circuit 355 on the first IC chip 310 via the conductive component 317.

In addition, the package 300 is suitably configured that the surfaces of the two IC chips are close to each other to enable the two IC chips to be thermally coupled together. In an embodiment, the heating element 330 and the temperature sensing element 340 are suitably positioned and aligned with temperature sensitive circuits on the first IC chip 310, such as the PLL in the functional circuit 351. Therefore, the heating element 330 and the temperature sensing element 340 are thermally coupled with the temperature sensitive circuits. Then, the signal generated by the temperature sensing element 340 is more accurately indicative of the local chip temperature at the PLL, and the heating element 330 can more effectively raise the local chip temperature for the PLL.

According to an aspect of the disclosure, the package 300 includes bonding balls 301 or pins (not shown) to receive or output signals. One of the bonding balls 301 receives electrical power, such as a supply voltage VDD, from a power source. The electrical power is then provided to the heating control circuit 320 on the second IC chip 315 and the chip power control circuit 355 on the first IC chip 310. The chip power control circuit 355 receives the control signal from the heating control circuit 320, and provides the electrical power to the various functional circuits 351-352 based on the control signal. Specifically, in an example, the chip power control circuit 355 includes a power distribution grid that distributes the electrical power to the various functional circuits 351-352. Further, the chip power control circuit 355 includes switch control logic circuits that can switch on/off the whole power distribution grid or portions of the power distribution grid based on the control signal from the heating control circuit 320.

According to an aspect of the disclosure, the heating control circuit 320 is not sensitive to temperature and can be operative in a relatively large temperature range including temperatures below the operating range of the functional circuit 351, such as the industrial temperature range of [−40° C., 125° C.], The heating control circuit 320 receives the electrical power that enters the package 300, and can properly start operation even when the chip temperature is relatively low, such as when the temperature is in [−40° C., 0° C.].

In an embodiment, the electrical power is provided by a switchable power source. Before the power source is switched on, the IC chips 310 and 315 in the package 300 typically have a chip temperature that is about the same as an ambient temperature that may be out of the commercial temperature range of [0° C., 125° C.], such as below zero. When the power source is switched on, the heating control circuit 320 is powered up and operates properly.

In an embodiment, when the heating control circuit 320 is powered up, the heating control circuit 320 provides the control signal to control the chip power control circuit 355 not to provide the electrical power to the temperature sensitive circuits, such as the PLL. Then, the heating control circuit 320 receives the signal that is indicative of the local chip temperature of the temperature sensitive circuits from the temperature sensing element 340. Based on the local chip temperature, the heating control circuit 320 adjusts the control signal to the chip power control circuit 355.

In an example, when the local chip temperature is in the commercial temperature range, the heating control circuit 320 adjusts the control signal to control the chip power control circuit 355 to provide the electrical power to the temperature sensitive circuits. When the local chip temperature is blow the lower limit of the commercial temperature range, the heating control circuit 320 maintains the control signal not to provide the electrical power to the temperature sensitive circuits. In addition, the heating control circuit 320 controls the heating element 330 to generate heat to raise the chip temperature, especially the local chip temperature of the temperature sensitive circuits, to above the lower limit of the commercial temperature range. Then, the heating control circuit 320 adjusts the control signal to let the chip power control circuit 355 to provide the electrical power to the temperature sensitive circuits.

According to an embodiment of the disclosure, the heating control circuit 320 then controls the heating elements 330 to maintain the chip temperature to stay in a suitable range, such as the commercial temperature range, and the like.

According to an aspect of the disclosure, the IC chip 310 includes a sleep mode. In an example, when the IC chip 310 enters the sleep mode, portions of the circuits, such as the functional circuit 351 that is temperature sensitive, is turned off. For example, the chip power control circuit 355 switches off a portion of the power distribution grid and thus not to distribute the electrical power to the functional circuit 351.

In an embodiment, when the functional circuit 351 is turned off, the heating control circuit 320 turns off the heating element 330 to save power. At a wake-up time, the heating control circuit 320 works similarly as at the power startup time to raise the local temperature of the functional circuit 351 to above the lower limit of the commercial temperature range, and then controls the chip power control circuit 355 to provide the electrical power to the functional circuit 351.

It is noted that, in another embodiment, in the sleep mode, the heating control circuit 320 controls the heating element 330 to maintain the local temperature above the lower limit of the commercial temperature range. Thus, at the wakeup time, the electrical power can be provided to the functional circuit 351 without waiting for raising the temperature.

It is noted that, in an example, the functional circuit 352 is not sensitive to temperature, and can operate properly at lower temperatures, such as below the lower limit of the commercial temperature range. Then, no dedicated heating element is needed to heat the functional circuit 352.

Figure 4:
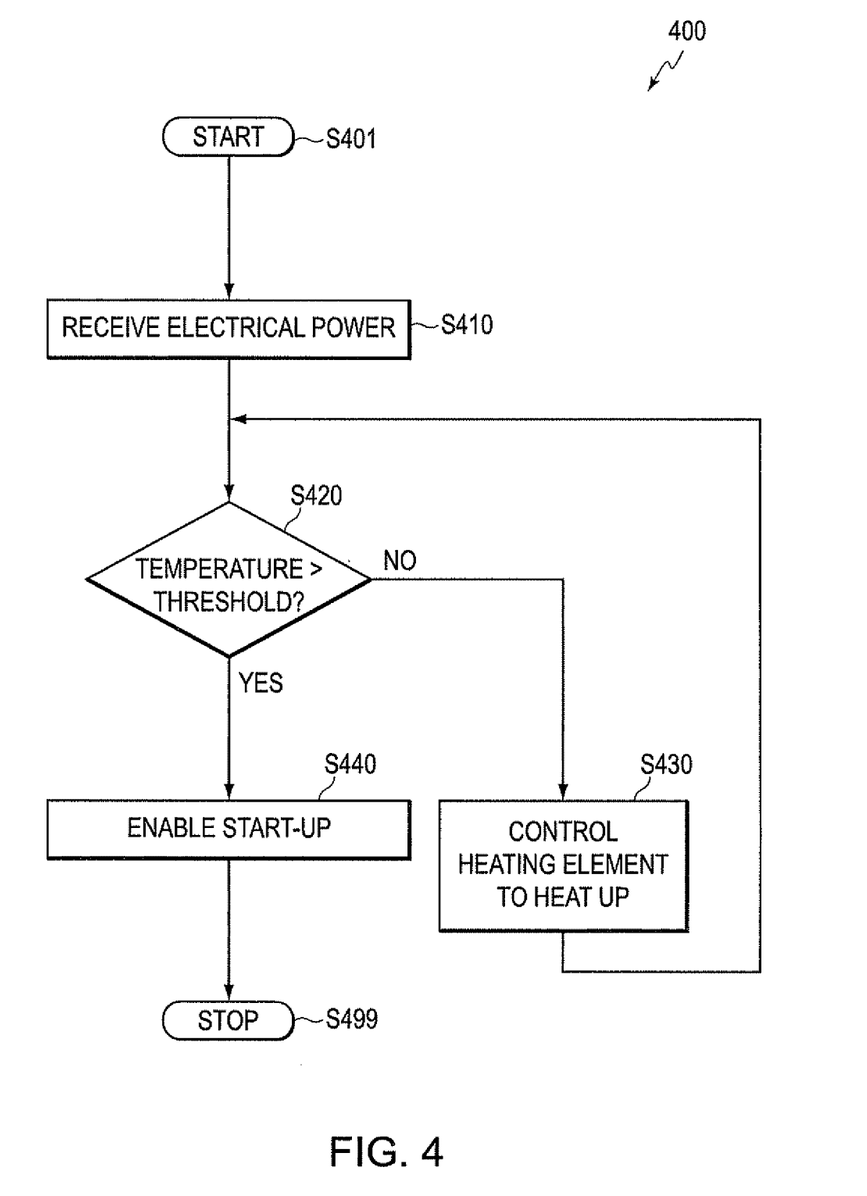
FIG. 4 shows a flow chart of a process example 400 according to an embodiment of the disclosure.

FIG. 4 shows a flow chart of a process example 400 according to an embodiment of the disclosure. The process can be executed by a heating control circuit, such as the heating control circuits 120, 220 and 320. The process starts at S401 and proceeds to S410.

At S410, electrical power is provided to an IC device, such as the IC chip 210, the IC package 300, and the like. The heating control circuit in the IC device receives the electrical power, and starts operation. In an example, the heating control circuit can start to operate at a low chip temperature. For example, before receiving the electrical power, the temperature of the IC device is about the same as the ambient temperature that can be below the lower limit of the commercial temperature range. In an embodiment, at power start-up time, when the heating control circuit starts operation, the heating control circuit sends a control signal to a chip power control circuit to control the chip power control circuit not to provide electrical power to temperature sensitive circuits. In another embodiment, at default, the chip power control circuit does not provide power to the temperature sensitive circuits in response to a power start-up.

At S420, the heating control circuit determines whether the chip temperature is above a threshold. In an example, the heating control circuit receives a signal from a temperature sensing element that is indicative of the chip temperature. When the chip temperature is above the threshold, such as the lower limit of the commercial temperature range, the process proceeds to S440; otherwise, the process proceeds to S430.

At S430, the heating control circuit controls one or more heating elements to heat up the IC device. In an embodiment, one of the heating elements is a local heating element that heats up a local area on an IC chip. In another embodiment, one of the heating elements is a global heating element that distributes heat across the IC chip. Then, the process returns to S420.

At S440, the heating control circuit provides the control signal to the chip power control circuit to enable the chip power control circuit to provide electrical power to the temperature sensitive circuits for power start-up, then the process proceeds to S499 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An integrated circuit (IC) chip, comprising:
    a heating element configured to be controllable to generate heat;
    a heating control circuit configured to be operable when an IC chip temperature is below a threshold, the heating control circuit receiving a signal from a temperature sensing element indicative of a sensed temperature and controlling the heating element to generate heat to raise the IC chip temperature when the sensed temperature is below the threshold; and
    a circuit on the integrated circuit (IC) chip configured to be operative when the sensed temperature is above the threshold.

2. The IC chip of claim 1, wherein
    the heating control circuit is configured to control a power control circuit to provide electrical power to the circuit when the sensed temperature is raised above the threshold.

3. The IC chip of claim 2, wherein the heating control circuit is configured to control the heating element to generate heat to keep the sensed temperature above the threshold.

4. The IC chip of claim 1, wherein the temperature sensing element and the heating element are thermally coupled with the circuit.

5. The IC chip of claim 1, wherein the circuit includes a phase-locked loop (PLL) configured to generate a clock signal.

6. The IC chip of claim 1, wherein the IC chip is electrically and thermally coupled with another IC chip that includes a functional circuit configured to be operative when the sensed temperature is above the threshold.

7. The IC chip of claim 6, wherein the heating control circuit is configured to control a power control circuit on the other IC chip to provide electrical power to the circuit when the sensed temperature is raised above the threshold.

8. The IC chip of claim 7, wherein the heating control circuit is configured to control the heating element to generate heat to keep the sensed temperature above the threshold.

9. The IC chip of claim 1, wherein the heating element is at least partially disposed in a layer dedicated to provide a circuit heating function.

10. A method, comprising:
    powering up a heating control circuit configured to be operable when a temperature is below a threshold at which circuits on an integrated circuit chip are functional;
    receiving a signal indicative of a sensed temperature;
    controlling a heating element formed of circuitry components thermally coupled to the integrated circuit chip to generate heat when the sensed temperature is below the threshold to heat up the integrated circuit chip; and
    providing electrical power to a circuit on the integrated circuit chip when the sensed temperature is above the threshold.

11. The method of claim 10, wherein receiving the signal indicative of the sensed temperature further comprises:
    generating the signal indicative of the sensed temperature of a circuit configured to be operative when the sensed temperature is above the threshold.

12. The method of claim 11, further comprising:
    controlling the heating element to heat up the circuit before powering up the circuit when the sensed temperature is below the threshold.

13. The method of claim 12, further comprising:
    controlling the heating element to generate heat to maintain the sensed temperature above the threshold.

14. An integrated circuit (IC) package, comprising:
    a first IC chip having a circuit configured to be operative when a temperature is above a threshold; and
    a second IC chip electrically and thermally coupled with the first IC chip, the second IC chip comprising:
        a heating element configured to be controllable to generate heat; and a heating control circuit configured to be operable when an IC chip temperature is below the threshold, the heating control circuit receiving a signal from a temperature sensing element indicative of a sensed temperature and controlling the heating element to generate heat when the sensed temperature is below the threshold, wherein the heating control circuit is configured to control a power control circuit on the first IC chip to provide electrical power to the circuit when the sensed temperature is raised above the threshold.

15. The IC package of claim 14, wherein the heating control circuit is configured to control the heating element to generate heat to keep the sensed temperature above the threshold.

16. The IC package of claim 14, wherein the heating element is at least partially disposed in a layer of one or more of the IC chips dedicated to provide a circuit heating function.

* * * * *